(12) United States Patent
Koroglu et al.

(10) Patent No.: US 11,190,147 B1
(45) Date of Patent: Nov. 30, 2021

(54) LOW POWER, EFFICIENT DOHERTY POWER AMPLIFIER

(71) Applicant: Silicon Laboratories Inc., Austin, TX (US)

(72) Inventors: Mustafa Koroglu, Austin, TX (US); Luigi Panseri, Austin, TX (US); Yu Su, Austin, TX (US); Vitor Pereira, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/904,821

(22) Filed: Jun. 18, 2020

(51) Int. Cl.
| | |
|---|---|
| *H04K 1/02* | (2006.01) |
| *H03F 1/02* | (2006.01) |
| *H03F 3/21* | (2006.01) |
| *H04B 1/04* | (2006.01) |
| *H03F 1/32* | (2006.01) |

(52) U.S. Cl.
CPC ......... *H03F 1/0288* (2013.01); *H03F 1/3241* (2013.01); *H03F 3/211* (2013.01); *H04B 1/0475* (2013.01); *H03F 2200/451* (2013.01); *H04B 2001/0425* (2013.01)

(58) Field of Classification Search
CPC ...... H03F 1/0288; H03F 1/3241; H03F 3/211; H03F 2200/451; H04B 1/0475; H04B 2001/0425
USPC ................................ 375/296, 295, 219, 316
See application file for complete search history.

(56) References Cited

U.S. PATENT DOCUMENTS

| | | | |
|---|---|---|---|
| 10,338,646 B1 * | 7/2019 | Vilhonen | H03F 1/3241 |
| 2018/0019711 A1 * | 1/2018 | Wang | H04B 1/0483 |
| 2018/0358930 A1 * | 12/2018 | Haine | H03F 3/193 |

OTHER PUBLICATIONS

W.H. Doherty, "A New High Efficiency Power Amplifier For Modulated Waves," May 1936, 25 pages total.
Ercan Kaymaksut, et al., "CMOS Transformer-Based Uneven Doherty Power Amplifier for WLAN Applications," 2011, 4 pages total.
Song Hu, et al. "28/37/39GHz Multiband Linear Doherty Power Amplifier in Silicon for 5G Applications," 2019, 12 pages total.
Ercan Kaymaksut, et al., "Transformer-Based Uneven Doherty Power Amplifier in 90 nm CMOS for WLAN Applications," IEEE Journal of Solid-State Circuits, vol. 47, No. 7, Jul. 2012, 13 pages total.

* cited by examiner

*Primary Examiner* — Zewdu A Kassa
(74) *Attorney, Agent, or Firm* — Trop, Pruner & Hu, P.C.

(57) ABSTRACT

In one embodiment, an apparatus includes: a digital baseband circuit to receive a digital baseband signal and output a first digital baseband signal and a second digital baseband signal, the second digital baseband signal comprising a scaled version of the first digital baseband signal; a first transmitter signal path coupled to the digital baseband circuit to process the first digital baseband signal and output a first radio frequency (RF) signal; a second transmitter signal path coupled to the digital baseband circuit to process the second digital baseband signal and output a second RF signal; a first power amplifier coupled to the first transmitter signal path to amplify the first RF signal and output an amplified first RF signal; and a second power amplifier coupled to the second transmitter signal path to amplify the second RF signal and output an amplified second RF signal.

18 Claims, 10 Drawing Sheets

LOW POWER, EFFICIENT DOHERTY POWER AMPLIFIER

BACKGROUND

A radio frequency (RF) power amplifier (PA) is typically designed to maximize linearity and power efficiency. One example use case is for transmitting orthogonal frequency division multiplexing (OFDM) modulated signals, due to a high peak-to-average power ratio (PAPR). A linear PA characteristic is required to meet stringent error vector magnitude (EVM) requirements, especially for certain modulations used for high data rate applications. Therefore in order to meet linearity requirements, PA average output is backed-off to provide enough headroom for preserving a certain level of PAPR at the PA output. Load impedance of the PA is optimized to maximize power (PSAT) and efficiency of the PA, and is dictated by the desired average power of the transmitted OFDM signal. Therefore, once the load impedance is optimized for PSAT, PA power efficiency is significantly degraded when the PA operates at low instantaneous power levels. This adversely impacts operation, especially in low power applications.

SUMMARY OF THE INVENTION

In one aspect, an apparatus includes: a digital baseband circuit to receive a digital baseband signal and provide a first digital baseband signal to a first transmitter signal path and a second digital baseband signal to a second transmitter signal path, the second digital baseband signal comprising a scaled version of the first digital baseband signal; the first transmitter signal path coupled to the digital baseband circuit to process the first digital baseband signal and output a first RF signal; the second transmitter signal path coupled to the digital baseband circuit to process the second digital baseband signal and output a second RF signal; a first power amplifier coupled to the first transmitter signal path to amplify the first RF signal and output an amplified first RF signal; and a second power amplifier coupled to the second transmitter signal path to amplify the second RF signal and output an amplified second RF signal.

In an example, the digital baseband circuit comprises a swap circuit to phase shift the second digital baseband signal and invert a portion of the second digital baseband signal. The second transmitter signal path may include: a converter to convert the second digital baseband signal to a second analog baseband signal; and a mixer to upconvert the second analog baseband signal to the second RF signal and provide the second RF signal to the second power amplifier.

In an example, the apparatus may further include an LC network coupled to an output of the first power amplifier to convert an impedance of the amplified first RF signal. The LC network may be a series inductor coupled to an output of the first power amplifier and at least one shunt capacitor coupled to the output of the first power amplifier. The apparatus further may include a balun coupled to the LC network and the second power amplifier to output a combined RF signal including the amplified first RF signal and the amplified second RF signal. The balun may be coupled to the LC network and the second power amplifier via a first output node and a second output node, the amplified first RF signal and the amplified second RF signal to be combined into the combined RF signal in a current domain at the first output node and the second output node.

In an example, the second power amplifier comprises a transconductor having: a first transistor having a gate terminal to receive the second RF signal and a second terminal to output the amplified second RF signal; a second transistor having a first terminal to receive the amplified second RF signal and a second terminal to output the amplified second RF signal; and a third transistor having a gate terminal to receive an enable signal, wherein when the digital baseband signal is less than a threshold level, the enable signal is inactive to disable the second amplifier.

The digital baseband circuit may include a scaling circuit to generate the scaled version of the first digital baseband signal, the scaling circuit comprising a lookup table including a plurality of scaling values. The scaling circuit may select a first scaling value of the plurality of scaling values based on a magnitude of the first digital baseband signal, and generate the scaled version of the first digital baseband signal using the first scaling value. When the magnitude of the first digital baseband signal is at or below a threshold level, the second power amplifier may be disabled.

In another aspect, a method comprises: receiving, in a baseband circuit of a transmitter, a baseband signal including modulated information to be transmitted; providing the baseband signal to a main signal path of the transmitter and to an auxiliary signal path of the transmitter; scaling and phase shifting the baseband signal in the auxiliary signal path to obtain an auxiliary baseband signal, based at least in part on magnitude information of the baseband signal; converting the baseband signal in the main signal path to a main RF signal and amplifying the main RF signal in a first power amplifier to output an amplified main RF signal; converting the auxiliary baseband signal in the auxiliary signal path to an auxiliary RF signal and amplifying the auxiliary RF signal in a second power amplifier to output an amplified auxiliary RF signal, the amplified auxiliary RF signal phase-shifted with respect to the amplified main RF signal; and combining the amplified main RF signal and the amplified auxiliary RF signal into a combined RF signal in a current domain.

In an example, the method further comprises outputting the combined RF signal to a load circuit, comprising converting an impedance of the combined RF signal to a load impedance level and converting the combined RF signal comprising a differential signal to a single-ended signal to be provided to the load circuit. The method further may include impedance converting the amplified main RF signal before the combining. The method also may include pre-distorting the baseband signal for a distortion of at least the first power amplifier and the second power amplifier. When the magnitude information of the baseband signal is equal to or less than a threshold level, the second power amplifier may be disabled. Phase shifting the baseband signal may include inverting an in-phase portion of the baseband signal and swapping the in-phase portion and a quadrature phase portion of the baseband signal.

In yet another aspect, an apparatus includes: a digital baseband circuit to receive and process a digital baseband signal, which may include: a pre-distortion circuit to pre-distort the digital baseband signal based at least in part on a magnitude of the digital baseband signal; a scaling circuit to scale the pre-distorted digital baseband signal based at least in part on a magnitude of the pre-distorted digital baseband signal; and a swap circuit to phase shift the scaled pre-distorted digital baseband signal. The apparatus further may include: a first digital-to-analog converter to convert a first digital baseband signal comprising the pre-distorted digital baseband signal to a first analog baseband signal; a second digital-to-analog converter to convert a second digital baseband signal comprising the phase-shifted scaled pre-distorted digital baseband signal to a second analog baseband signal; a first analog baseband circuit to process the first analog baseband signal; a second analog baseband circuit to process the second analog baseband signal; a first mixer to convert the first analog baseband signal to a first RF signal; a second mixer to convert the phase-shifted second analog baseband signal to a second RF signal; a first power amplifier to amplify the first RF signal and output an amplified first RF signal; and a second power amplifier to amplify the second RF signal and output an amplified second RF signal.

In an example, the swap circuit is further to invert an in-phase portion of the scaled pre-distorted digital baseband signal. The apparatus further may include: an LC network coupled to an output of the first power amplifier to convert an impedance of the amplified first RF signal; and a balun coupled to the LC network and the second power amplifier to output a combined RF signal including the amplified first RF signal and the amplified second RF signal, wherein the combined RF signal is combined in a current domain.

DETAILED DESCRIPTION

In various embodiments, a transmitter is configured with a Doherty power amplifier to enable greater efficiency. Such Doherty PA includes separate amplifiers, where a first amplifier may be active at levels lower than a saturation operating level. Then a second power amplifier may contribute to the output power, increasing efficiency. To this end, the Doherty power amplifier implements a load modulation technique in order to maintain high efficiency at both high and low power levels.

For low power applications, embodiments may restore the PA efficiency when output power is backed off, by optimizing the load impedance for low power levels and dynamically modulating the load such that load impedance reduces when the signal level reaches higher levels.

In embodiments herein, a Doherty PA architecture is implemented using two transconductor amplifiers (main and auxiliary) to drive a load impedance. Furthermore, various signal processing may be performed at baseband to control an amplitude of the auxiliary signals and further to provide a phase shift to ensure reduced load impedance at higher input signal levels, avoiding the need for RF attenuators and RF phase shifters. This technique to dynamically adjust the amplitude level of the signal driving the auxiliary PA results in linear, constant PA gain at high power levels, which is critical for transmission of OFDM signals Still further, embodiments may combine the amplified signals output from the two PAs in a current domain. On-chip inductors may be used to implement an impedance converter, avoiding the need for a quarter wavelength transmission line. Furthermore, a scheme can be implemented to disable the bias current of the auxiliary PA when the PA transmits low instantaneous power, leading to further efficiency improvement. A transmitter architecture in accordance with an embodiment using a Doherty PA may also implement digital pre-distortion to eliminate or at least reduce amplitude modulation-phase modulation (AM-PM) and residual AM-AM distortion. These techniques result in a compact, low power, highly efficient and low-cost transmitter that can transmit, e.g., OFDM signals with desired performance.

Figure 1:
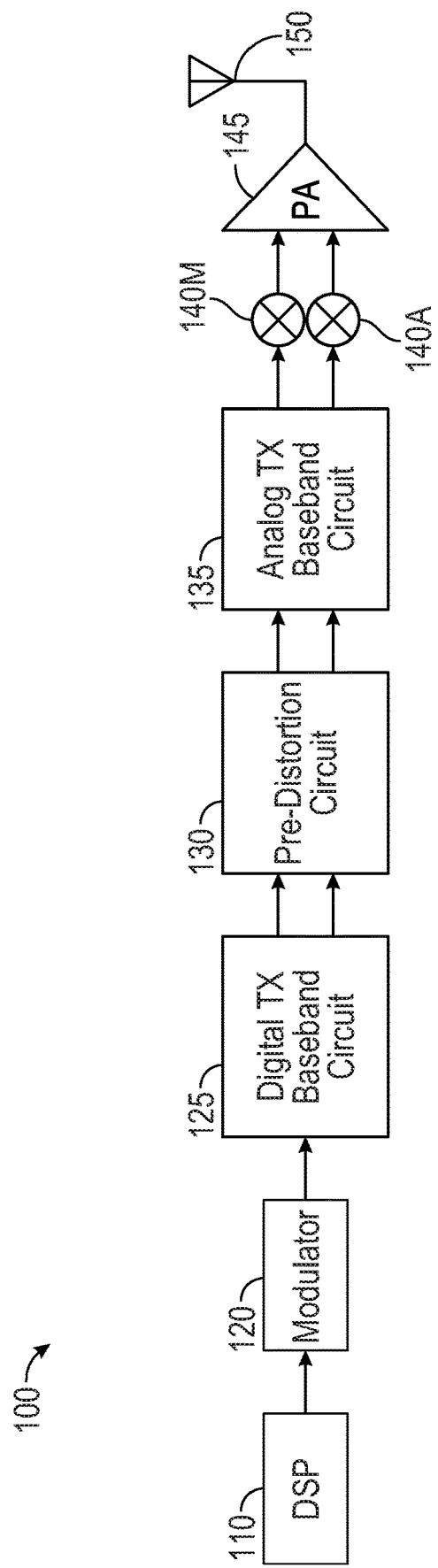
FIG. 1 is a block diagram of a device in accordance with an embodiment.

Referring now to FIG. 1, shown is a block diagram of a device in accordance with an embodiment. As shown in FIG. 1, device 100 may be any type of device including radio functionality. As one example, device 100 may be an integrated circuit (IC) that includes radio functionality, such as a transceiver to communicate according to one or more wireless communication protocols, such as a Wi-Fi protocol in accordance with an IEEE 802.11 standard. Of course, device 100 may be part of a larger system including radio functionality such as a given computing and/or communication device, among other examples.

More specifically, device 100 may be an IC including all the circuitry shown (with the exception of an antenna 150). In FIG. 1, circuitry relevant to a Doherty PA implementation is shown. Understand that additional circuitry, including a full receiver chain may be present.

As illustrated, device 100 includes a digital signal processor (DSP) 110 that may include various control capabilities. In addition, DSP 110 may include or is coupled to circuitry that generates messages for communication. As such, DSP 110 outputs such messages to a modulator 120. In an embodiment, modulator 120 may modulate these messages according to a given modulation scheme, e.g., orthogonal frequency division multiplexing (OFDM) modulation. In turn, modulated signals are provided to a digital transmit baseband circuit 125. Understand that in some cases, modulator 120 may output complex digitally modulated signals to digital transmit baseband circuit 125. In turn, digital transmit baseband circuit 125 may perform various processing on the modulated signals, such as oversampling, filtering, gain control (aka power back off), calibration for image rejection and local oscillator (LO) leakage. In an embodiment, digital transmit baseband circuit 125 may store or otherwise access power back off values, e.g., based on a given modulation type and rate.

Digital transmit baseband circuit 125 may include two separate dedicated paths, namely a so-called main path and a so-called auxiliary path. As will be described further herein, by way of independent signal processing of signal information of these two different paths, input swing to an auxiliary portion of the Doherty PA may be dynamically controlled at baseband, simplifying hardware complexity. To this end, digital transmit baseband circuit 125 itself may include separate main and auxiliary paths. While the same signal processing may be performed in both paths, additional signal processing may be performed in the auxiliary path, e.g., to implement amplitude scaling of the auxiliary path signals.

Still with reference to FIG. 1, these modulated signals of the two different paths are provided to a pre-distortion circuit 130. In embodiments herein, pre-distortion circuit 130 may be configured to pre-distort these modulated signals according to an expected distortion that is incurred in a transmit path. As such non-linearities of various components including (but not limited to) an analog transmit baseband circuit 135, mixers 140M,A and an amplifier 145 may be corrected. In embodiments, pre-distortion circuit 130 may be configured to pre-distort the incoming signals for both magnitude and phase distortions.

While not shown at this high level in FIG. 1, it is possible for pre-distortion circuit 130 to be implemented within, more generally, digital transmit baseband circuit 125. In implementations, the dynamic scaling of auxiliary path signals may be performed after pre-distortion. Of course in other implementations this scaling may occur before pre-distortion. Furthermore, while pre-distortion may improve PA performance, in other implementations no digital pre-distortion occurs. In addition, digital transmit baseband circuit 125 may perform a baseband swap with regard to the auxiliary signal path signals.

Still with reference to FIG. 1, after pre-distorting the signals, the pre-distorted signals of the two separate signal paths are provided to analog transmit baseband circuit 135. Baseband circuit 135 may further process these pre-distorted signals, including filtering, gain control and so forth. While FIG. 1 at the high level shown does not display separate digital and analog baseband paths, understand that separate baseband circuits are provided for the two signal paths here as well. As such, independent signal processing of main path signals and auxiliary path signals occurs both in digital transmit baseband circuit 125 and analog transmit baseband circuit 135. As a result, additional RF components such as an RF attenuator and RF phase shifter may be avoided, reducing hardware complexity.

As further shown in FIG. 1, the processed baseband signals of the two paths are provided to corresponding mixers 140M,A. In an embodiment, each mixer 140 may be implemented as a complex mixer. Mixers 140 may upconvert signals, e.g., from a baseband frequency (or intermediate frequency or other such frequency) to a radio frequency (RF). Note in the illustration, separate mixers are shown for the main and auxiliary signal paths. Mixers 140 may be identical to each other to maintain a 90 degree phase shift between the main and auxiliary signal paths.

In turn, the RF signals are provided to amplifier 145. In embodiments herein, amplifier 145 is implemented as a Doherty power amplifier. Thus as with the other circuitry in FIG. 1, PA 145 may include separate main and auxiliary PAs, each of which is configured to receive the RF signals of a given path (which may be differential signals at this point) and output amplified RF signals (which also may be differential signals and may be output as current signals to be combined with the corresponding output of the other PA). As seen, the combined RF signal output from PA 145 is sent as an amplified RF signal to an antenna 150 for communication to one or more devices, e.g., in a wireless local area network with device 100. Understand while shown at this high level in the embodiment of FIG. 1, many variations and alternatives are possible.

Device 100 may be particularly suited for low power applications. As examples, device 100 may be included in an Internet of things (IoT) device or other small device that operates on, e.g., battery power. In such applications, power consumption is desired to be as low as possible. As such, using a Doherty power amplifier as described herein may realize reduced power consumption at various operating levels. Such low power operation may be achieved even when output power is backed off from a saturation power level at which a load impedance is optimized for maximum efficiency.

Figure 2A:
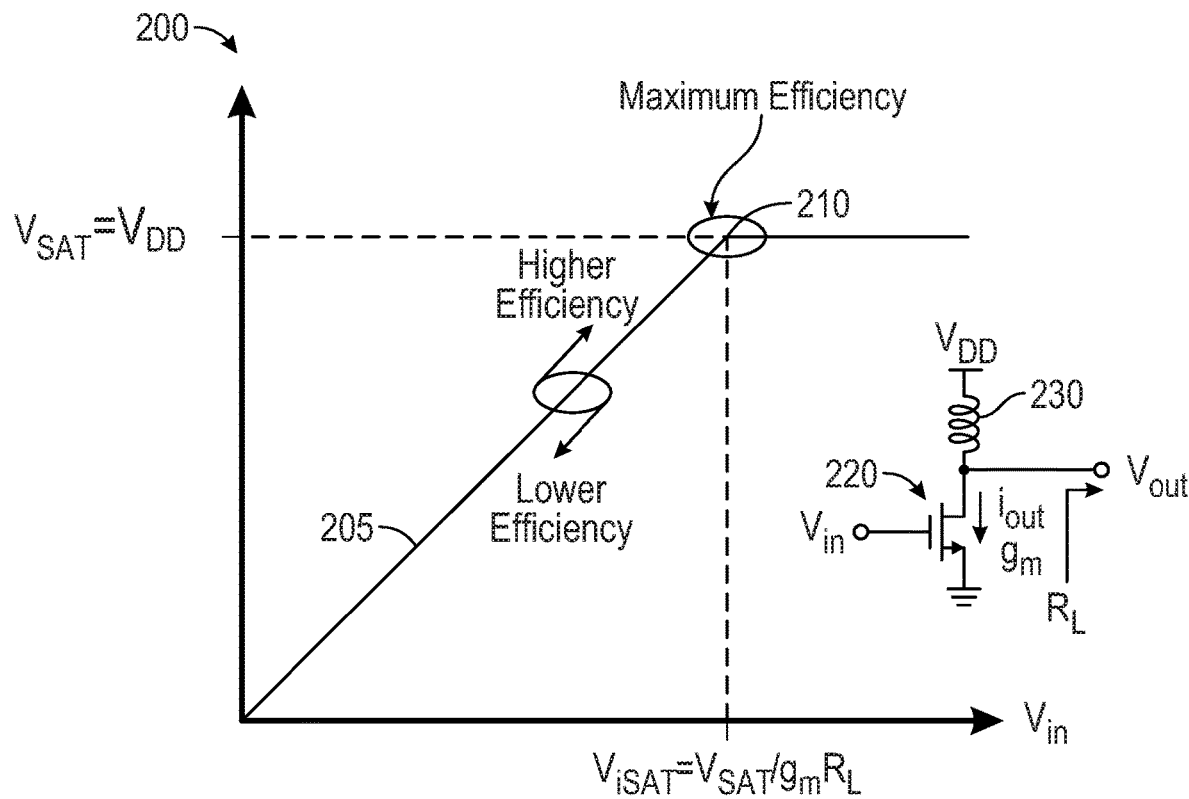
FIG. 2A is a graphical illustration of power amplifier efficiency.

To illustrate power efficiency of a power amplifier, reference may be made to FIG. 2A. Referring now to FIG. 2A, shown is a graphical illustration 200 of power amplifier efficiency. In FIG. 2A, an efficiency curve 205 shows output power on the Y-axis and input voltage on the X-axis. As shown, as input voltage increases from zero, output power increases linearly, until a maximum efficiency point 210 is reached. At input voltage levels lower than maximum efficiency point 210, the PA operates at lower efficiency.

FIG. 2A further shows a high-level schematic representation of a PA, shown as a metal oxide semiconductor field effect transistor (MOSFET) 220, which has a gate terminal to receive the input voltage and a drain terminal to output an output current at an output voltage node. For representation, an inductor 230 couples between the drain terminal of transistor 220 and a supply voltage node (VDD). With this arrangement, the PA delivers current to a load, represented by a load impedance (RL) until a drain-to-source voltage equals zero, at the peak power level. Therefore, for this particular PA, the saturation voltage level, Vsat, is equal to VDD. When the PA operates at this peak output power level with an input voltage of Visat=Vsat/gmRL, efficiency is maximized as the output voltage headroom is fully used. Note that this level is shown at maximum efficiency point 210. However, at lower output power levels, efficiency is degraded as this output voltage headroom is not fully used. Furthermore, in typical implementations in which a PA is controlled to operate at some level of power back off from a maximum output level, lower efficiency results. Such degraded efficiency may occur in part due to load impedance being designed for a saturation power level (VSAT) that is too small for lower power levels.

Figure 2B:
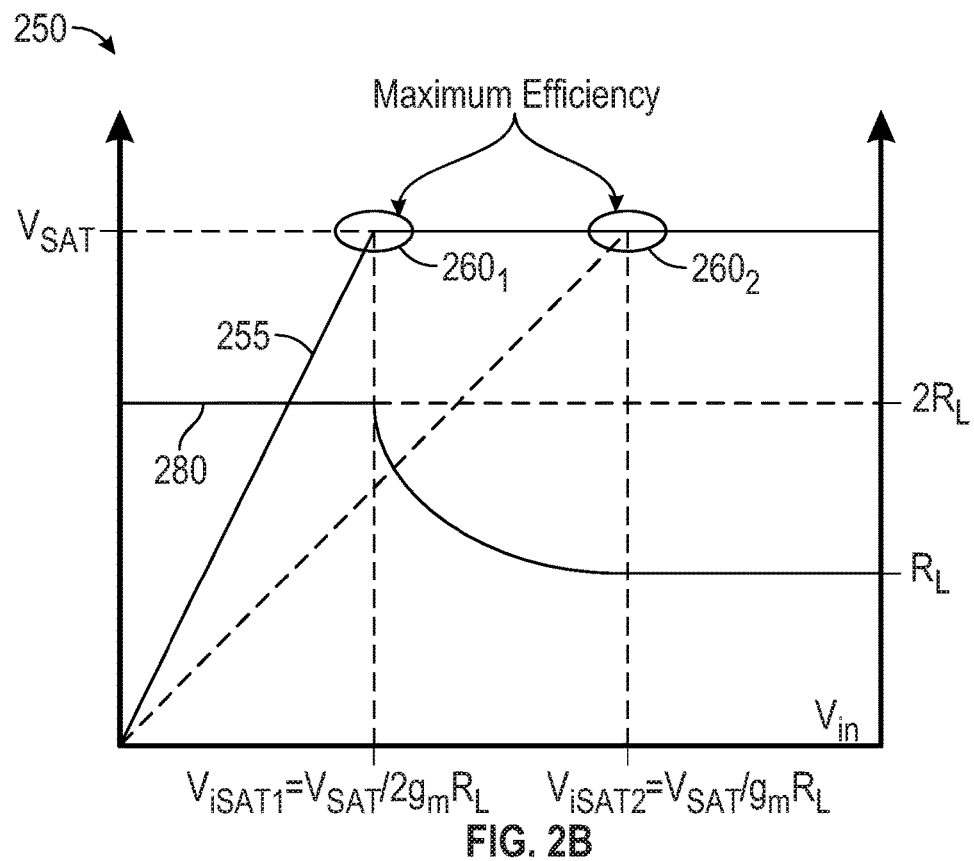
FIG. 2B is a graphical illustration of power efficiency using a load modulation technique.

In FIG. 2B, a graphical illustration 250 of power efficiency using a load modulation technique as described herein is illustrated. As shown in FIG. 2B, by dynamically modulating a load impedance, more efficient PA operation may be realized and as such, higher power can be delivered. Thus, as shown in FIG. 2B, efficiency curve 255 may provide for multiple maximum efficient operating points $260_{1,2}$. Note that this operation may be realized by dynamically modulating a load impedance, represented by curve 280. As seen, a first load impedance level (2RL) may be present until the PA saturates at a first input saturation voltage of $Visat_1=Vsat/2gmR_L$ at efficiency point $260_1$. And as shown, the load may be dynamically modulated lower to a smaller impedance level (RL) at a second maximum efficiency point $260_2$ at a second input saturation voltage of $Visat_2=Vsat/gmR_L$. At this point, the PA may deliver 3 dB higher power than at first maximum efficiency $260_1$. As such, when current drive increases, the PA's load impedance of 2RL is fixed until the first input saturation voltage is attained. Beyond this point, load impedance may be dynamically lowered, allowing a higher current to be delivered while the output voltage level remains at VSAT. Thus at second maximum efficiency operating point $260_2$, the PA may see half the impedance than at first maximum efficiency operating point $260_1$.

In embodiments herein, a Doherty PA may be used to realize this dynamic load modulation technique. Further as described herein, signals of two different paths, main and auxiliary, may be controlled digitally to provide a scaled and phase-shifted auxiliary signal with respect to the main signal, thus reducing hardware constraints and improving operation. Furthermore, by providing a power combining mechanism in which the output power of the two amplifiers is combined in the current domain, a more efficient and less complex design is achieved.

Figure 3A:
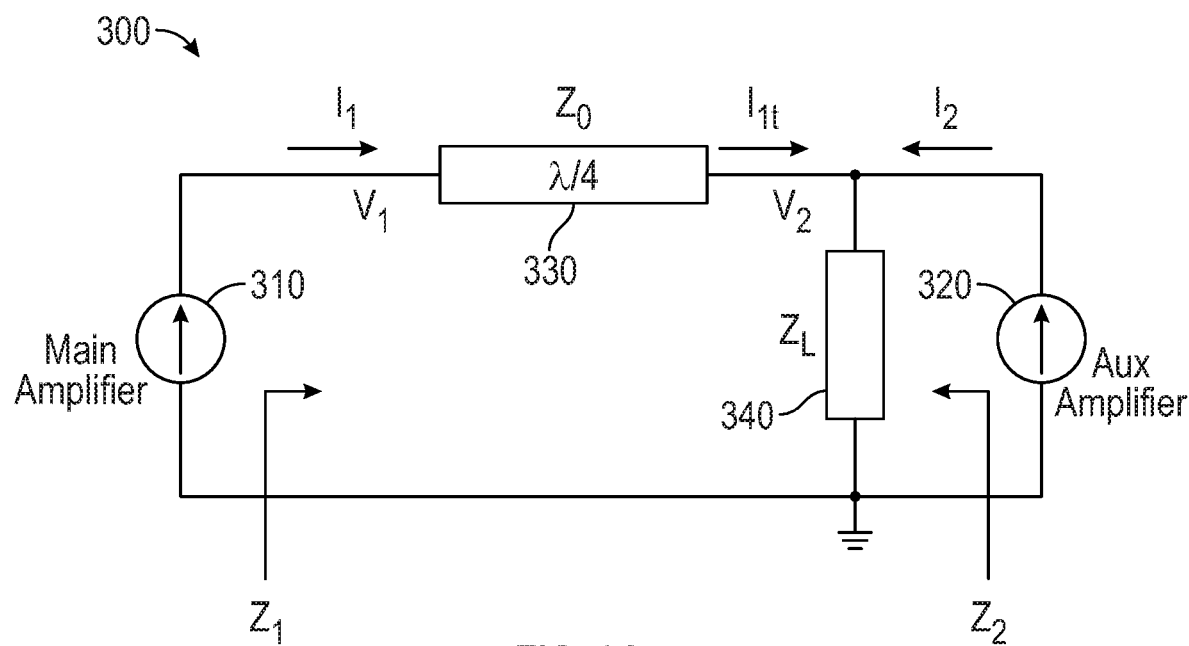
FIG. 3A is a high level block diagram representation of a Doherty power amplifier.

Referring now to FIG. 3A, shown is a high level block diagram representation of a Doherty PA. As shown in FIG. 3A, PA 300 includes a main amplifier 310 and an auxiliary amplifier 320, each of which sees a respective load impedance 340 coupled to the amplifiers. In addition, a ¼ wave impedance converter 330 couples between main amplifier 310 and load impedance 340.

With this configuration:

$$I_{1t} = \frac{-jV_1}{Z_0}$$
$$V_2 = -jI_1 Z_0$$
$$V_2 = (I_{1t} + I_2)Z_L$$

$$Z_1 = \frac{V_1}{I_1} = Z_0\left(\frac{Z_0}{Z_L} - j\frac{I_2}{I_1}\right)$$
$$Z_2 = \frac{V_2}{I_2} = -j\frac{Z_0}{(I_2/I_1)}$$

Suppose that $I_2 = -j\alpha I_1$ and $Z_L = Z_0/2$ $$\Rightarrow Z_1 = Z_0(2-\alpha) \quad Z_2 = Z_0/\alpha$$

$\alpha=1$ corresponds to $|I_2|=|I_1|$. Both main and auxiliary amplifiers deliver ½ $P_{max}$ power to equivalent impedance of $Z_0$. Therefore the total power delivered to load is $P_{max}$. $\alpha=0$ corresponds to $|I_2|=0$. While the main amplifier delivers maximum power to $2Z_0$, which is equal to ¼ $P_{max}$, the auxiliary amplifier is disabled. This point is 6 dB below $\alpha=1$ case. Since the main PA load is twice as high and the auxiliary PA is off, total current dissipation is one-fourth as compared to $\alpha=1$ case and hence efficiency is preserved.

As such, when the main power amplifier is operating at lower signal levels, it sees a higher impedance (as the auxiliary amplifier is either off or operating at low contribution levels). In turn, when the input signal starts increasing, the auxiliary power amplifier starts contributing to the power output, thus modulating the impedance that the main power amplifier sees (namely lowering this impedance level). In this way, efficiency may be improved.

Figure 3B:
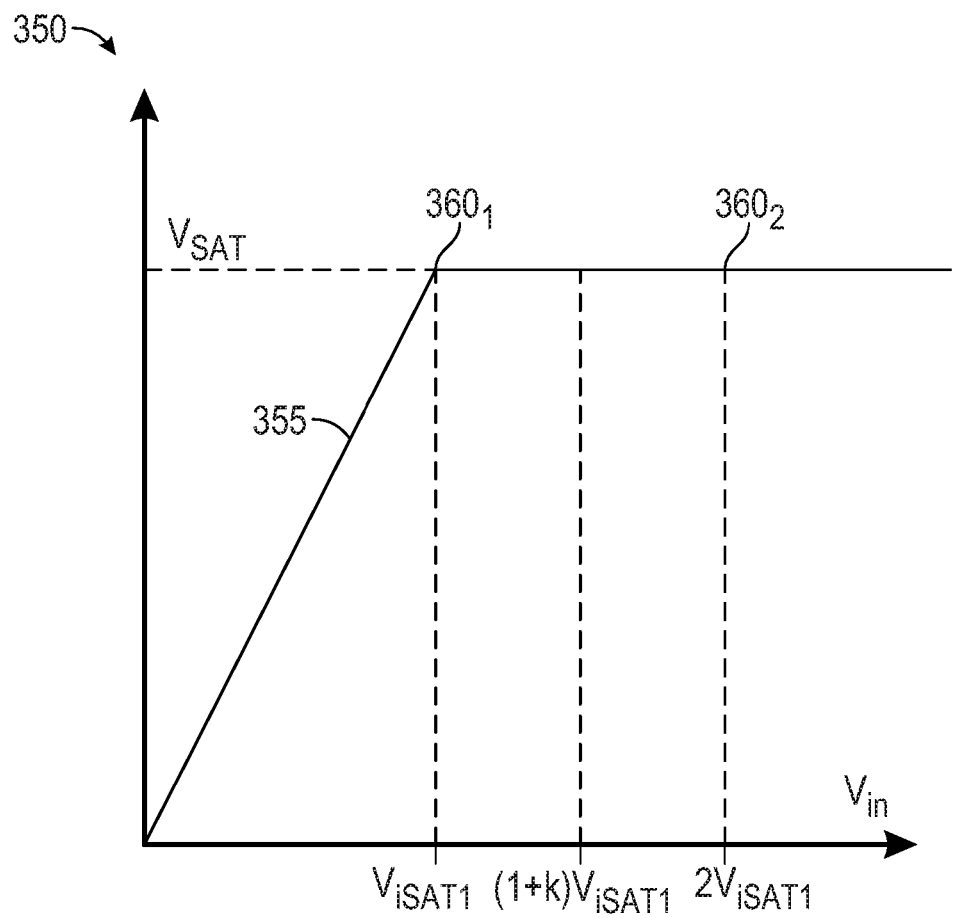
FIG. 3B is a graphical illustration of a Doherty power amplifier input output characteristics.

In FIG. 3B, a graphical illustration 350 of input output characteristics of the main power amplifier is shown. As shown in FIG. 3B, by dynamically modulating a load impedance, more efficient PA operation may be realized by fully utilizing voltage headroom and as such, higher power can be delivered with higher efficiency. Following operation in a linear region 355, the PA may provide for multiple maximum efficient operating points 3601,2. Note that in this implementation, when input signal levels are below a first saturation voltage (Visat$_1$), which may correspond to a power back off of more than 6 dB, an auxiliary amplifier may be disabled and power is output only from a main power amplifier, which operates in the linear region. At the point that input signal levels exceed this first saturation voltage, e.g., at a power back off level of less than 6 dB, a controllable amount of output power contribution from an auxiliary amplifier may occur. Then at the point that twice the input saturation voltage is received (2Visat$_1$), both amplifiers may fully operate.

As shown in FIG. 3B, when power back-off is by more than 6 dB, $V_{in}<V_{ISAT1}$: $\alpha=0$, i.e., the auxiliary amplifier is not active. The main amplifier output is below $V_{SAT}$ and therefore the PA operates in linear region. In this region, the power delivered to the load is:

$$P_{out}=P_{main}=(g_m V_{in})^2 Z_1 = 2(g_m V_{in})^2 Z_0$$

$$¼ P_{max}=2(g_m V_{iSAT1})^2 Z_0.$$

When power back-off is up to 6 dB, $V_{ISAT1}<V_{in}<2V_{ISAT1}$: $0<\alpha<1$, i.e., both main and auxiliary PAs are active with load modulation. Let $V_{in}=(1+k)V_{ISAT1}$ where $0<k<1$. In order to keep the main PA output at $V_{SAT}$, load impedance, $Z_1$, is reduced by a factor of $(1+k)$:

$$\Rightarrow Z_1 = Z_0(2-\alpha) = \frac{2Z_0}{1+k} \Rightarrow \alpha = \frac{2k}{1+k} \Rightarrow Z_2 = \frac{Z_0}{\alpha} = Z_0 \frac{2k}{1+k}$$

Here, the main amplifier delivers power to the load impedance of $Z_1=Z_0(2-\alpha)$: $P_{main}=(g_m V_{in})^2 Z_0(2-\alpha) = (g_m V_{in})^2 Z_0 2/(1+k)$. The auxiliary amplifier delivers power to the load impedance of $Z_2=Z_0/\alpha$; $P_{aux}=(\alpha g_m V_{in})^2 Z_0/\alpha = (g_m V_{in})^2 Z_0 2 k/(1+k)$. The total power delivered to load, $Z_L$ is thus: $P_{out}=P_{main}+P_{aux}=2(g_m V_{in})^2 Z_0$. Therefore, the power characteristic at a Doherty PA stays linear all the way up to $P_{max}$ while efficiency is preserved.

Figure 4:
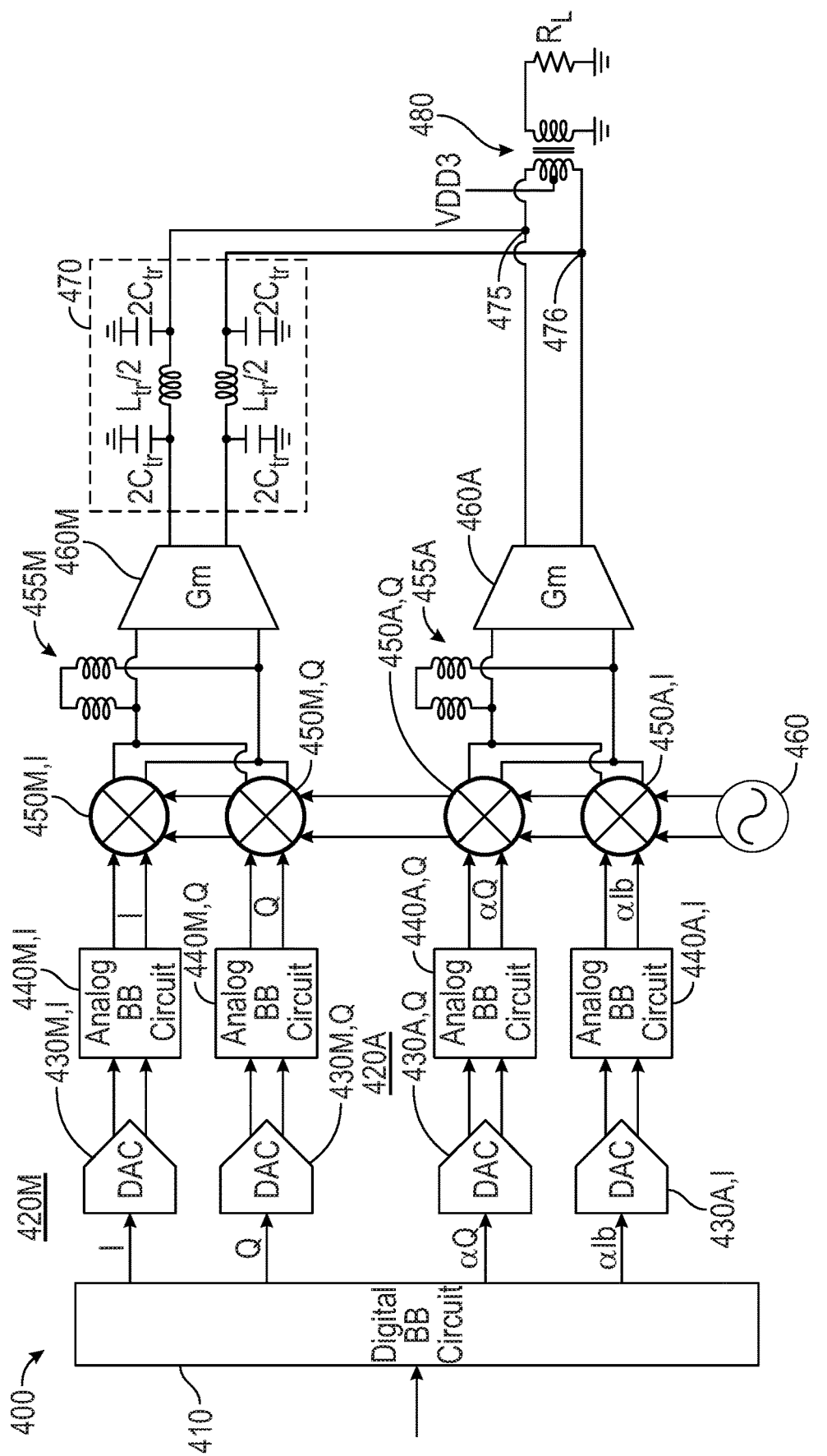
FIG. 4 is a block diagram of a transmitter in accordance with an embodiment.

Referring now to FIG. 4, shown is a block diagram of a transmitter in accordance with an embodiment. As shown in FIG. 4, transmitter 400 may be implemented on a single semiconductor die (with the exception of a load resistance, e.g., an antenna). In embodiments, transmitter 400 may be implemented in a given IC such as a wireless transceiver. In the high level view shown in FIG. 4, incoming modulated signals are provided to a digital baseband circuit 410 that includes separate baseband signal paths for main and auxiliary digital signal processing. More specifically these different paths of digital baseband circuit 410 are provided for a main signal path 420M that in turn couples to a main power amplifier 460M and an auxiliary signal path 420A that in turn couples to an auxiliary power amplifier 460A. By way of these separate and independent signal paths, different signal processing may be performed on signals of two paths, such that an input swing into auxiliary PA 460A,M may be dynamically controlled at baseband to control a contribution of PA 460A into an output.

As an example, samples of the incoming modulated signals to digital baseband circuit 410 may have a bandwidth of 9 or 10 bits. In a given implementation, the modulated signals may be provided in complex form. Digital baseband circuit 410 may perform various processing on these incoming signals, such as various filtering, gain control or so forth. As described herein, digital baseband circuit 410 may apply a scaling factor to signals provided to auxiliary signal path 420A, as illustrated by way of the alpha value shown in FIG. 4. In addition, digital baseband circuit 410 may perform a swap of the signals of auxiliary signal path 420A, thus swapping in-phase and quadrature portions (and inverting the in-phase portion) to realize a phase shift digitally at baseband.

As further illustrated in FIG. 4, separate sets of complex digital baseband signals are provided to signal paths 420M, A. In signal path 420M, separate, identical digital-to-analog converters (DACs) 430M,I/Q are provided to convert analog signals to digital signals. Note that in the embodiment shown DACs 430 may be implemented as differential DACs to output, for each complex signal component (I and Q), differential signals. As shown, these differential analog baseband signals are provided to corresponding analog baseband circuits 440M,I/M,Q. Various analog processing may occur in these circuits, including smoothing low-pass filtering to attenuate DAC sampling images and variable gain adjustments. In turn, these processed analog baseband signals are provided to corresponding complex mixers 450M,I/M,Q.

To enable up-conversion, a local oscillator (LO) signal is provided to mixers 450 from a frequency synthesizer 460. Mixers 450 may operate to convert the signals to RF levels and output the RF signals to main PA 460M. As shown, a pair of inductors 455M couple to the signal paths between mixers 450M and main PA 460M. Inductors 455 may act, along with input capacitance of PAs 460, as a resonator to suppress harmonic content created in mixers 450 and reduce current consumption of mixers by resonating out input capacitance of PAs.

As shown, main PA 460M may be implemented as a transconductor. In various embodiments, main PA 460M may include multiple slices or cells, each of which can be independently enabled and disabled, e.g., based on desired operating levels, power consumption levels or so forth. Transconductors of main PA 460M are configured to receive incoming voltage signals and output amplified current signals.

Before discussing the power combining operation of transmitter 400, a discussion of auxiliary signal path 420A is provided. In general, auxiliary signal path 420A may include the same components as main signal processing path 420M. And in particular embodiments, various components may be substantially matched. More generally, circuitry of main signal path 420M and auxiliary signal path 420A may be implemented as replicated circuitry, e.g., having the same design characteristics. In this way, signals that pass through the different paths may be equally matched, other than for the scaling and phase shift performed in auxiliary signal processing path 420A. Thus in the high level view shown in FIG. 4, auxiliary signal path 420 includes the same components, including DACs 430A,I/A,Q, analog baseband circuits 440A,I/A,Q, mixers 450A,I/A,Q and auxiliary PA 460A.

However, note that several variations between the two paths exist. First, as discussed above the digital baseband signals provided to these paths may have different amplitudes, as digital baseband circuit 410 applies scaling to the auxiliary path signal. This scaling may be dynamically controlled based on the signal level to control input swing into auxiliary PA 460A. While different implementations to realize such amplitude scaling may be possible, in one embodiment a lookup table-based approach may be used. In other cases, various gain calculations may be performed on the signals to realize this amplitude scaling. In any case, the auxiliary path signals output from digital baseband circuit 410A thus are of different amplitude (at least potentially) than the main path signals output from digital baseband circuit 410M.

In addition, the auxiliary path signals are further digitally transformed from the main path signal via included swapping circuitry that may be configured to perform a phase shift and inversion operation. Thus as illustrated in FIG. 4, the output of digital baseband circuit 410 includes auxiliary signals that are swapped, such that scaled, phase-shifted and inverted signals are output. More specifically, the in-phase differential signal is inverted, thus outputting an amplitude scaled, inverted signal (alpha Ib or bar). Understand that in other implementations, this swapping of auxiliary path signals may occur in analog baseband circuit 440, but this operation may be more complicated that digital swapping. In still other embodiments, swapping may be realized in a local oscillator.

Still with reference to FIG. 4, now considering the power combining of the amplified current signals output from PAs 460M,A, note that an impedance conversion may occur with regard to the main path signals. More specifically as shown in FIG. 4, to effect impedance conversion, an LC network 470 couples between an output of main PA 460M and corresponding output nodes 475, 476. With this arrangement of LC network 470, an impedance as seen by main PA 460M may be dynamically modulated based on the signal levels (namely based on activity level of auxiliary PA 460A). As one example, assume the LC network's characteristic impedance of 44 ohms. When auxiliary PA 460A is inactive, main PA 460M may see an impedance of twice this value, or 88 ohms. Stated another way, when auxiliary PA 460A is disabled, the impedance seen by the output of main PA 460M can be expressed as Zmain=$Zo^2$/Zload. Here, Zo=44 ohm, Zload=22 ohms. Instead when auxiliary PA 460A is fully active, the output impedance as seen by main PA 460M may be the characteristic value, or 44 ohms.

With further reference to LC network 470, note that each differential output path from main PA 460M includes a series-coupled inductor having corresponding shunt capacitors coupled at each end of the coil. In the implementation of FIG. 4, these inductors may have an inductance of $L_{TR}/2$, where $L_{TR}$ equals $-Z_0/\omega_0$. Note that $Z_0$ represents the characteristic impedance of the LC realization of a quarter length transmission line. And the capacitors may have a capacitance of $2C_{TR}$, where $C_{TR}$ equals $1/(Z_0/\omega_0)$. Of course while shown these particular values, other implementations are possible.

Also note that the power combining between outputs of main PA 460M and auxiliary PA 460A occurs in the current domain. That is, with the transconductors of the PAs, current signals are output and are readily combined simply by coupling differential output paths to each other at output nodes 475, 476. As a result, more efficient and easier coupling of these power combined signals occurs, e.g., without the need for a transformer-based combining stage.

After power combining at output nodes 475, 476, the resulting power combined differential signal is provided to a balun 480, which acts as an output impedance converter to convert the impedance from the output impedance as seen by PAs 460 to a load impedance level. In addition, balun 480 operates to convert to this differential signal to single-ended form. In FIG. 4, this load impedance is shown as a resistance RL. In an embodiment, this resistance may represent an off-chip antenna, which may have a nominal impedance of 50 ohms.

As discussed above, PAs may be implemented using transconductors. In a particular embodiment, main PA 460M and auxiliary PA 460A may be identical in that they have same size devices, layout and so forth, such that mismatches between the PAs are avoided. Further, the devices of the different PAs may be biased the same, such that the amplifiers may be configured for common class operation. For example, both main PA 460M and auxiliary PA 460A may be configured as Class B amplifiers.

Figure 5:
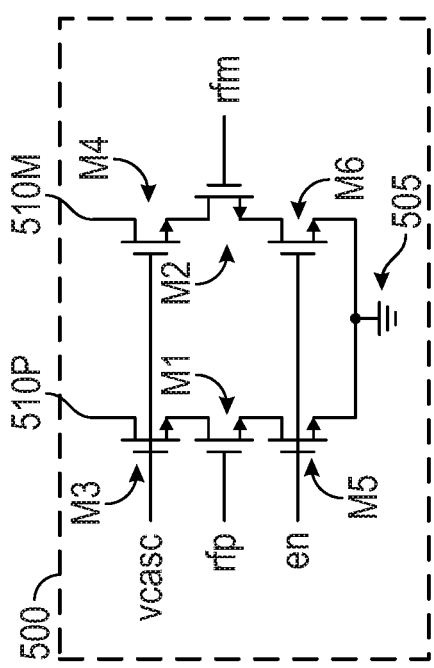
FIG. 5 is a high level schematic diagram of an auxiliary PA in accordance with an embodiment.

Referring now to FIG. 5, shown is a high level schematic diagram of an auxiliary PA in accordance with an embodiment. As shown in FIG. 5, PA 500 is shown at a high level to include a single transconductor stage. Understand that multiple such stages, slices or cells may be present and independently controlled based on a given chip configuration. As shown, an incoming differential RF signal, namely the auxiliary signal path signal, is provided to a pair of metal oxide semiconductor field effect transistors (MOSFETs) M1, M2. More specifically, MOSFETs M1, M2 may be implemented as n-channel MOSFETs (NMOS). As shown, each RF component couples to a gate terminal of one of NMOS devices M1 and M2. In turn, the drain terminals of NMOS devices M1, M2 couple to source terminals of cascode transistors M3 and M4. As seen, cascode transistors M3, M4 have gate terminals coupled to receive a cascode voltage Vcasc, and output, at their drain terminals, corresponding amplified current signals at output nodes 510 P, M. Cascode transistors M3, M4 may be high voltage IO transistors able to support large signal swings at PA outputs.

As further shown in FIG. 5, auxiliary PA 500 may also include additional NMOS devices M5, M6. As seen, these devices couple between a reference voltage node 505 (e.g., a ground node) and the source terminals of input NMOS devices M1, M2. And as shown, NMOS devices M5, M6 have gate terminals coupled to receive an enable signal. These transistors are used to adjust number of slices enabled and hence adjust PSAT of the entire PA based on a received enable signal. In an embodiment this enable signal may be received from digital baseband circuitry, which may send an inactive enable signal when a main PA is operating below saturation.

Figure 6:
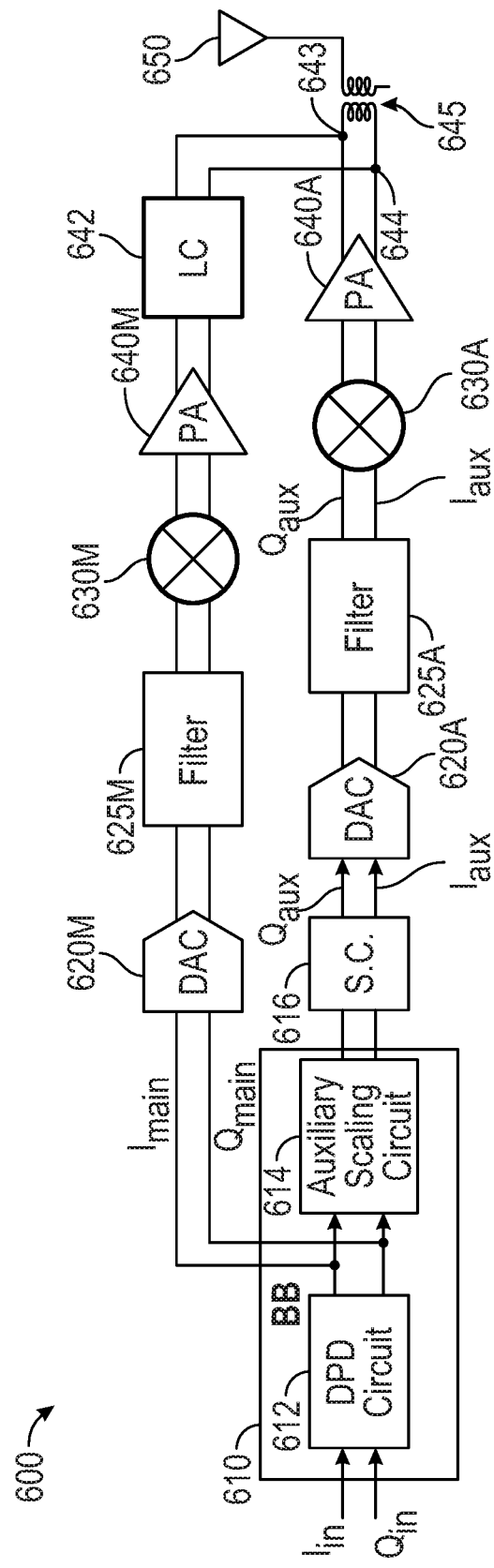
FIG. 6 is a block diagram of a wireless transmitter in accordance with an embodiment.

When there is no contribution to be made by auxiliary PA 500, e.g., due to low signal levels, the bias voltage at the gates of NMOS devices M1, M2 may disable auxiliary PA 500, reducing power consumption. Note that a similar configuration may be present in the stages or slices of main PA 460M. In some cases, slices of auxiliary and main PAs may be biased the same. Understand while shown at this high level in the embodiment of FIG. 5, many variations and alternatives are possible. Further, while the above discussion is for an auxiliary PA, understand that a main PA may have the same structure and control to control different slices Referring now to FIG. 6, shown is a block diagram of a wireless transmitter in accordance with an embodiment. While shown as a transmitter, understand that in various use cases, transmitter 600 may be part of a transceiver that also includes a receive path. As shown in FIG. 6, incoming modulated baseband signals, which may be complex signals, are received in a digital baseband circuit 610, which may perform various signal processing. Note here, digital baseband circuit 610 is shown to include a digital pre-distortion (DPD) circuit 612. DPD circuit 612 may pre-distort the incoming signals, e.g., based on a magnitude of the received signals. To this end, DPD circuit 612 may include one or more lookup tables. Depending on a signal level of the modulated signals, one or more entries may be accessed to obtain pre-distortion values which may be used to update the incoming complex baseband signals.

As shown, at the output of DPD circuit 612, main and auxiliary paths split, where the auxiliary path includes an auxiliary scaling circuit 614 to scale the incoming signals. In an embodiment, auxiliary scaling circuit 614 may include another lookup table, e.g., created at production test environment (at nominal temperature and supply voltage levels), which is used to store scaling values, e.g., alpha values. A selected one of these scaling values, obtained based on a magnitude of the pre-distorted main path signal input into auxiliary scaling circuit 614, may act as a coefficient. Thus auxiliary scaling circuit 614 may perform a computation to generate scaled auxiliary path signals based on the pre-distorted main path signal and the selected scaling value.

Next in the auxiliary path, a swapping circuit 616 may be configured to perform a phase shift of the auxiliary path signals. To this end, this phase delay may be realized by swapping the complex signals (I for Q) and further inverting the in-phase component. This scaled auxiliary path pre-distorted (and now phase-shifted) signal and the main path pre-distorted signal are provided, respectively, to main and auxiliary paths which include digital-to-analog converters (DACs) 620M,A and filters 625M,A. Although shown with these limited components, understand that additional baseband processing may be performed in certain embodiments.

Next, the baseband signals of the two paths may be upconverted via corresponding mixers 630M,A into RF signals that are provided to PA 640, which may be implemented as a Doherty amplifier that operates at Class B. Also understand that in other embodiments, PA 640 may be implemented in other configurations such as Class A amplifier, Class AB, Class C, or so forth. In different implementations, e.g., based on expected use cases and input signal levels, class levels of transconductors of PA 640 may be dynamically controlled. In some cases, bias levels for main and auxiliary PAs may differ to optimize overall efficiency. In some cases, an auxiliary PA may be biased for operation at a level between Class B and Class C operation, so that it turns off in low signal level conditions.

As such, separate PAs may be provided for main and auxiliary paths. And note that both inputs and outputs of PAs 640 may be differential signals. In turn, the amplified RF output signal from main path PA 640M couples through an LC network 642 formed of a series inductor and shunt capacitors, which acts as an impedance converter. In turn, output current signals are combined at nodes 643, 644 that in turn couple to ends of a coil of a balun 645. Balun 645 converts the output impedance to a load impedance and converts the differential output to a single-ended output, provided to an antenna 650. Understand while shown at this high level in the embodiment of FIG. 6, many variations and alternatives are possible.

Figure 7:
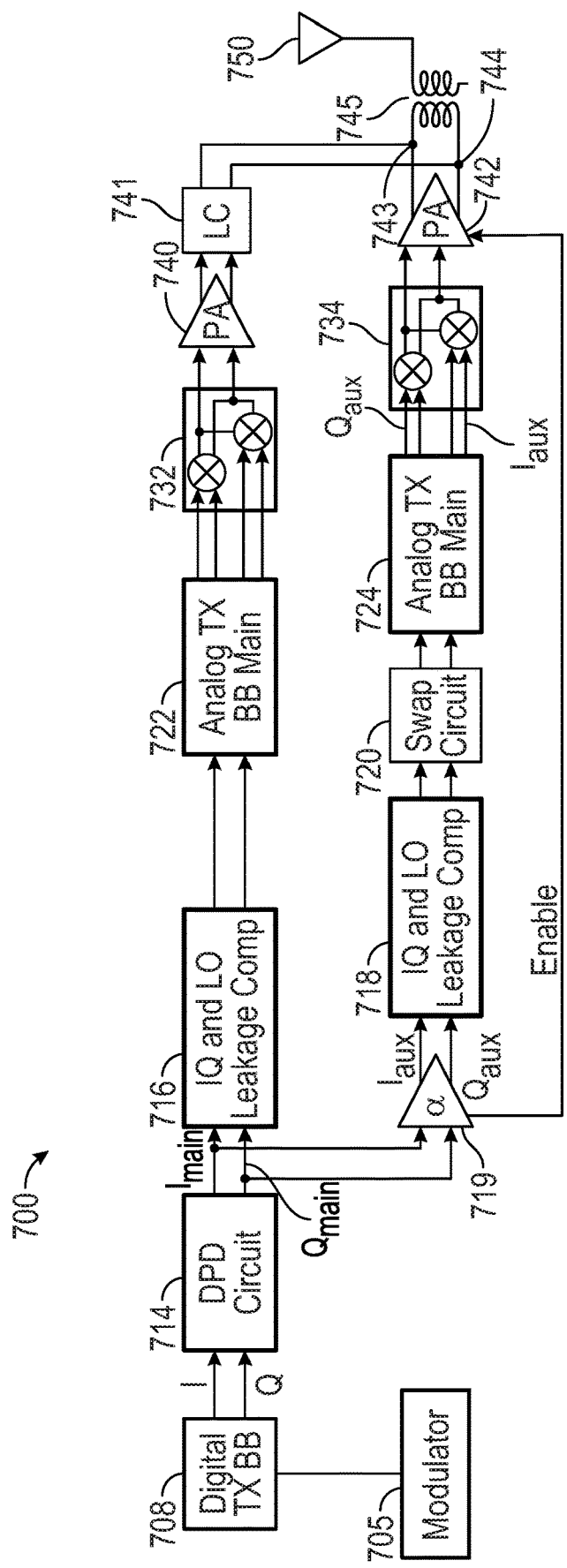
FIG. 7 is a block diagram of a wireless transmitter in accordance with another embodiment.

Referring now to FIG. 7, shown is a block diagram of a wireless transmitter in accordance with another embodiment. More specifically, wireless transmitter 700 shows further details of baseband processing of main and auxiliary path signals to effect input swing-based control of an auxiliary PA according to an embodiment.

As illustrated in FIG. 7, transmitter 700 includes a modulator 705 which may modulate incoming signals, e.g., according to an OFDM modulation scheme, to output, e.g., 9 or 10-bit modulated samples that are provided to a digital transmit baseband circuit 708. Digital transmit baseband circuit 708 may perform various processing on the signals. Digital transmit baseband circuit 708 may provide processed signals to a digital pre-distortion circuit 714. In general, a magnitude value may be determined from the input signals, e.g., according to a sum of squares technique to obtain a magnitude value of the complex signal. This value may be used to access a lookup table that stores pre-distortion values. While in many embodiments, a fixed lookup table may be provided, in some implementations a closed loop arrangement may be present such that adaptive pre-distortion may be performed. By way of pre-distortion, any magnitude or phase distortion of a PA may be removed.

The resulting pre-distorted signals may be split into main and auxiliary paths. As shown in FIG. 7, the auxiliary path signals may be sent to an auxiliary scaling circuit 719. Scaling circuit 719 may be configured to apply a scaling value, e.g., an alpha value, to the pre-distorted input signals. As such, this scaling occurs based on a magnitude of the pre-distorted signals, which may be used to access a given entry in a lookup table corresponding to a particular scaling value. In this way, an input signal swing into an auxiliary PA can be controlled at baseband. Thus at this point, it is possible that the signal levels differ between main and auxiliary paths. However, when the signal level is high enough, both PAs may be operating at saturation with an alpha value set at a value of one, such that the magnitude of the signals of the two signal paths are the same.

Still referring to FIG. 7, independent signals of the two paths are provided to further processing circuitry, including leakage compensation circuits 716, 718, which may provide IQ and local oscillator leakage compensation. While shown with this particular signal path arrangement in FIG. 7, with digital transmit baseband circuit 708 coupled to pre-distortion circuit 714, in turn coupled to (auxiliary scaling circuit 719) and compensation circuits 716, 718, it may generally be considered that all of this circuitry can be implemented as digital transmit baseband circuitry. In addition, it is possible in some cases for digital pre-distortion circuit 714 to be an optional item.

As further shown in the auxiliary signal path, after compensation, the auxiliary path signals are provided to a swap circuit 720. Swap circuit 720 may be configured to perform a phase shift of the auxiliary path signals with respect to the main path signals. In an embodiment, this phase shift may be realized by inverting the in-phase components and swapping the in-phase and quadrature components. As such, a 90° phase shift occurs at baseband.

The resulting signals pass through analog transmit baseband circuitry 722, 724, where filtering and other processing may be performed. In turn, the signals of the two paths are provided to complex mixers 732, 734. More particularly with regard to mixer 734, note that an in-phase portion of the complex mixer may receive quadrature signals and similarly, a quadrature portion of the complex mixer may receive inverted in-phase signals. As a result a desired phase shift is effected without requiring any action on the part of RF components.

After upconversion to RF via corresponding mixers 732, 734, the resulting RF signals of the two separate and independent paths (which may be at different signal levels and phase-shifted with respect to each other) are provided to respective PAs 740, 742. With embodiments herein, the power contribution of auxiliary PA 742 may be based on its input signal level, such that dynamic operation is effected based on input signal level.

In addition, when main PA 740 is operating below saturation levels, auxiliary PA 742 may be disabled, to reduce power consumption. To this end, as further illustrated in FIG. 7, scaling circuit 719 also may be configured to send an enable signal to auxiliary PA 742. When there is to be no power contribution from auxiliary PA 742 (such as when the alpha value is set at 0), scaling circuit 719 may reset the enable signal, thus disabling PA 742, reducing power consumption. More generally, the enable signal may be reset when the input power level is equal to or below a given threshold.

Still with reference to FIG. 7, to effect power combining in a current domain, the resulting amplified current signals output from PAs 740, 742 may be combined at output nodes 743, 744. To effect this power combining with regard to the signals of main path, a LC network 741 that operates as an impedance converter may couple between the output of main PA 740 and output nodes 743, 744. Finally, the combined output is coupled via a balun 745 to an antenna 745. Note that balun 745 may perform impedance conversion to a load impedance of antenna 745.

Figure 8:
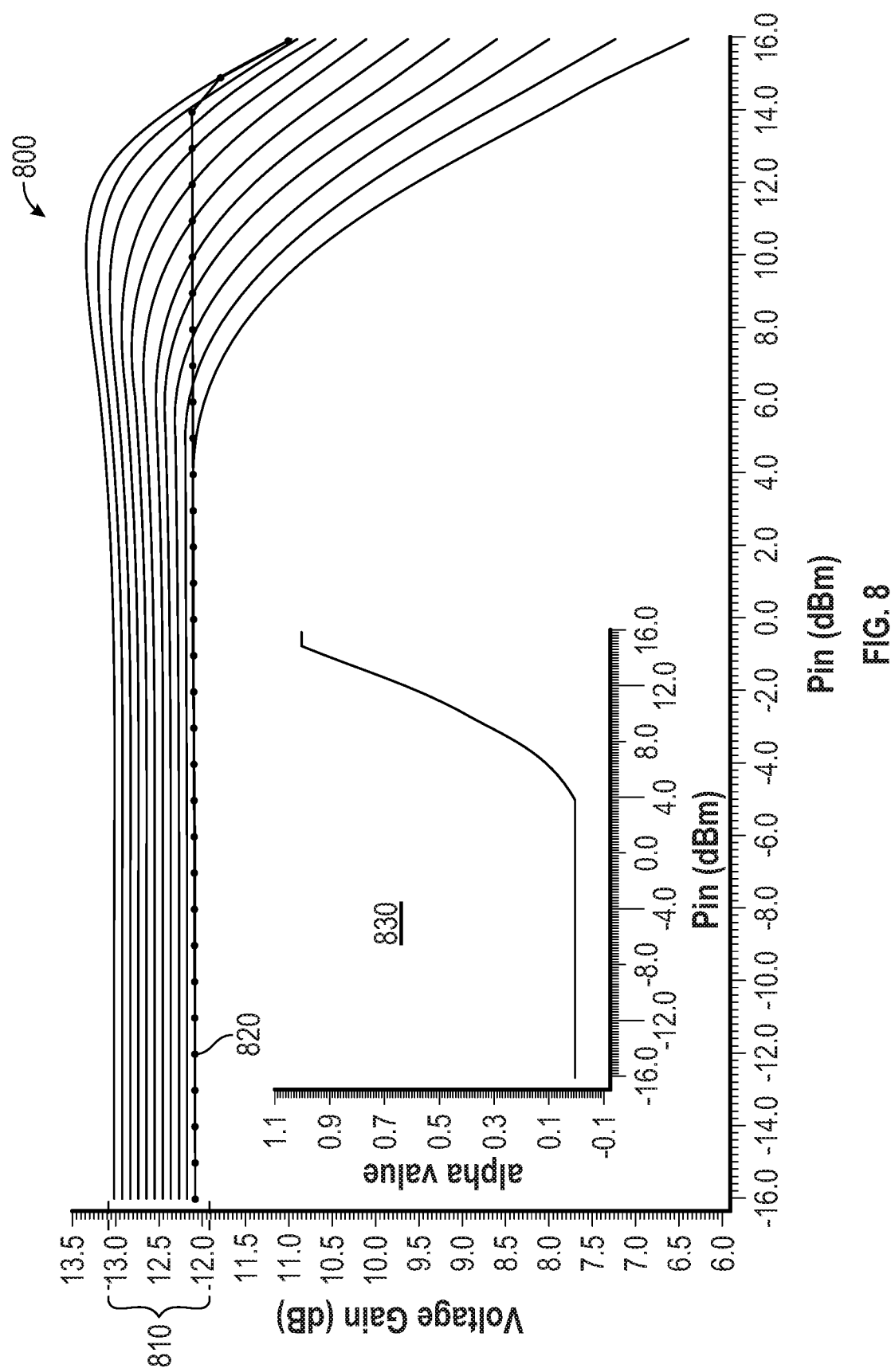
FIG. 8 is a graphical illustration of scaling factor operation in accordance with an embodiment.

Referring now to FIG. 8, shown is a graphical illustration of scaling factor operation in accordance with an embodiment. As shown in FIG. 8, a first graph 800 shows a set of curves 810 representing voltage gain of a Doherty power amplifier with different levels of auxiliary PA operation (Y-axis, voltage gain (in dB)) over an input power range (X-axis, in dBm). Thus different levels of auxiliary PA contribution may be controlled by use of different alpha values, each associated with one of curves 810. As shown, for lower input power levels, operation of the PA is substantially linear. However, as input power increases, different levels of auxiliary PA contribution leads to differences in gain characteristic. As seen, there are different falloffs in the various curves 810.

As further illustrated, a substantially linear gain characteristic curve 820 may be realized by using different alpha values of the different curves 810 at different levels of input power. This operation is further shown in graph 830 which represents an auxiliary PA input scaling factor (y-axis) based on input power (X-axis). As shown, by using different and larger alpha values as input power increases, a more linear gain characteristic of a PA may be realized. Note that a set of alpha values may be determined during design and/or validation of a given chip and then programmed into a lookup table as for as a set of fixed values. Note that in different cases, different considerations may dictate different selection of alpha values, such as to realize a flat gain to saturation levels, or gain variations to optimize main PA efficiency, as examples.

As discussed above, during operation, based on the determined input signal level, a selected alpha value may be obtained and used to scale the signals of the auxiliary signal path. Understand while shown with these example graphs and discussion in FIG. 8, other values and control options are possible in other embodiments.

Figure 9:
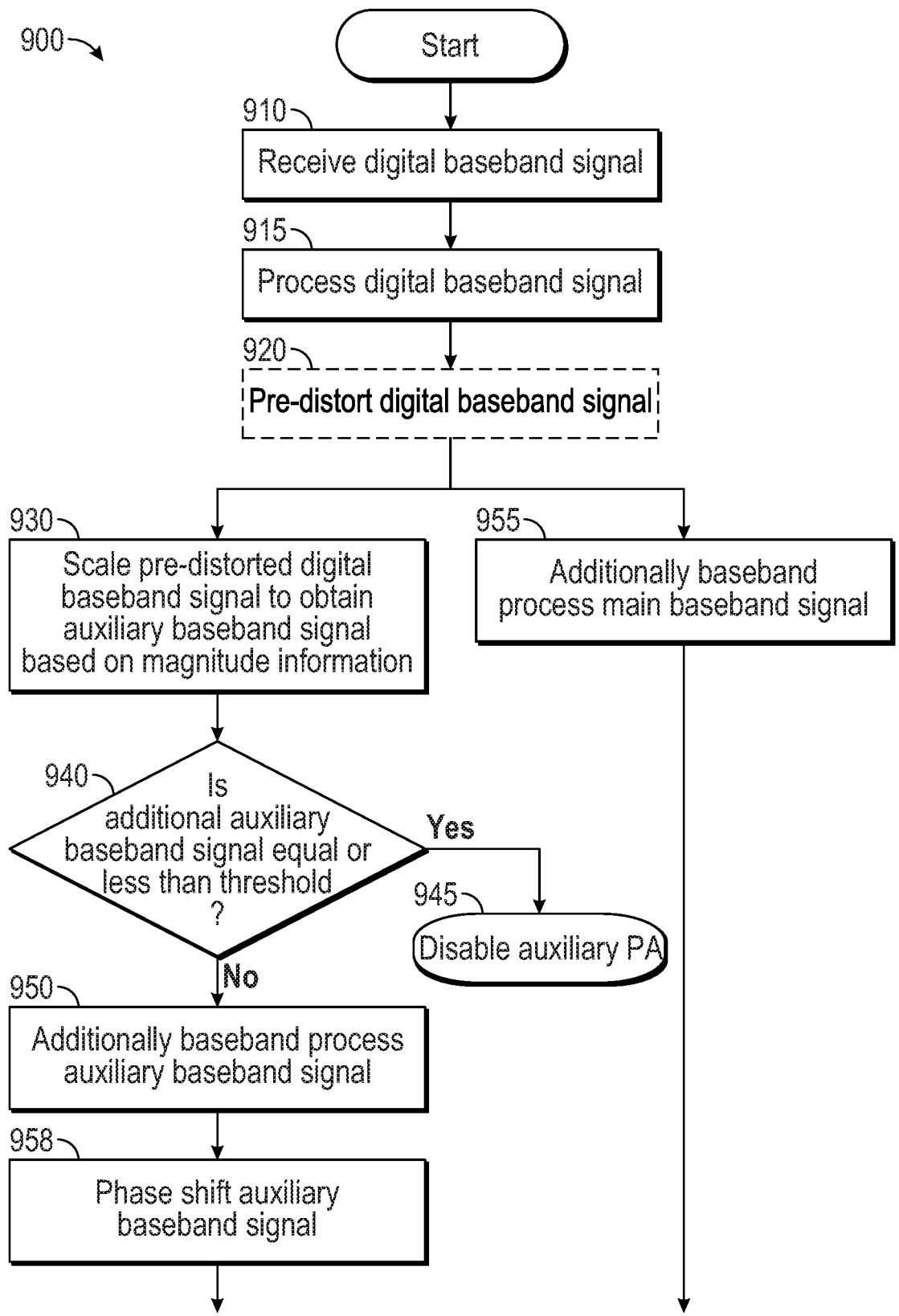
FIG. 9 is a flow diagram of a method in accordance with an embodiment.
Figure 9:
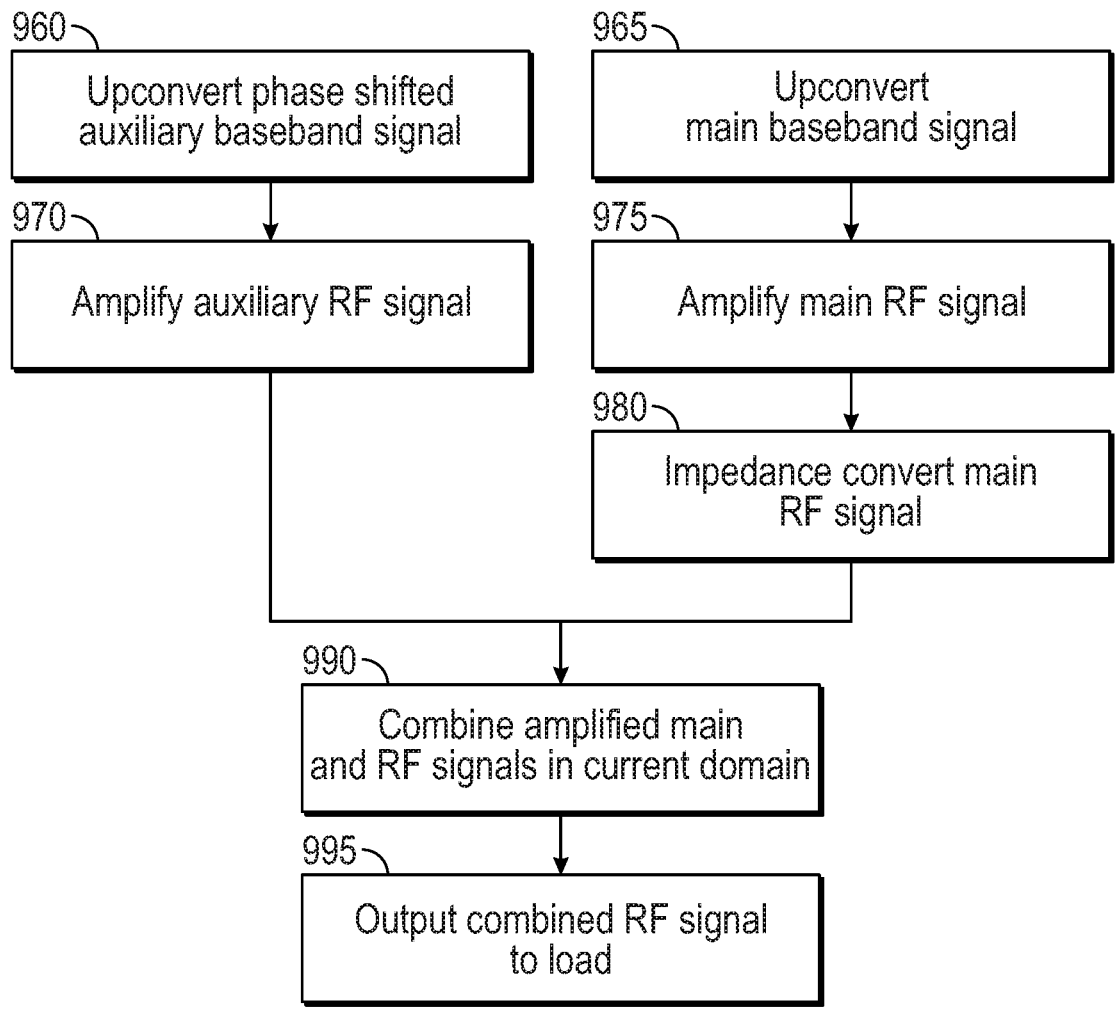

Referring now to FIG. 9, shown is a flow diagram of a method in accordance with an embodiment. As shown in FIG. 9, method 900 is a method of operating a transmitter in accordance with an embodiment. As illustrated, method 900 begins by receiving a digital baseband signal in a digital transmit baseband circuit (block 910). Next at block 915 the signal may be processed, e.g. including gain control, filtering or so forth.

Still referring to FIG. 9, next at optional block 920 the digital baseband signal may be pre-distorted, as discussed herein. Next, this signal may be scaled at block 930, e.g., in a scaling circuit to obtain an auxiliary baseband signal. Then it may be determined at diamond 940 whether this auxiliary baseband signal is equal to or less than a threshold level. As one example, the threshold may be set at zero. In other cases, this analysis may be based on the alpha value itself, such that the determination may be whether the alpha value is zero or not. In either case when the determination is in the positive, at block 945 a disable signal may be sent to the auxiliary PA to disable its operation.

Still with reference to FIG. 9, instead when a baseband signal is to be part of the contribution, at block 950 additional baseband processing of the auxiliary baseband signal may occur. Such processing may include various compensation features and so forth. Similar operations may occur for the main baseband signal at block 955. At block 958 the auxiliary baseband signal may be phase-shifted. And as described herein the phase shift may be effected by swapping in-phase and quadrature signals and inverting the in-phase signal.

Then at blocks 960, 965 the baseband signals of the two paths (the phase-shifted and scaled auxiliary baseband signal and the main baseband signal) may be upconverted in respective complex mixers. Thereafter at blocks 970, 975 the resulting RF signals may be amplified. Next at block 980 the amplified main RF signal may be impedance converted, e.g., using an LC network as described herein.

Still referring to FIG. 9, next at block 990 the RF signals of these two paths may be combined in the current domain (block 990). Such combining may be effected by coupling the output of auxiliary PA directly to output nodes and coupling the output of the LC network to the output nodes. Finally, at block 995 the combined RF signal may be output to a load, e.g., via a balun, which acts as an impedance converter and also converts the differential RF signal to single-ended form. Understand while shown at this high level in FIG. 9, many variations and alternatives are possible.

Figure 10:
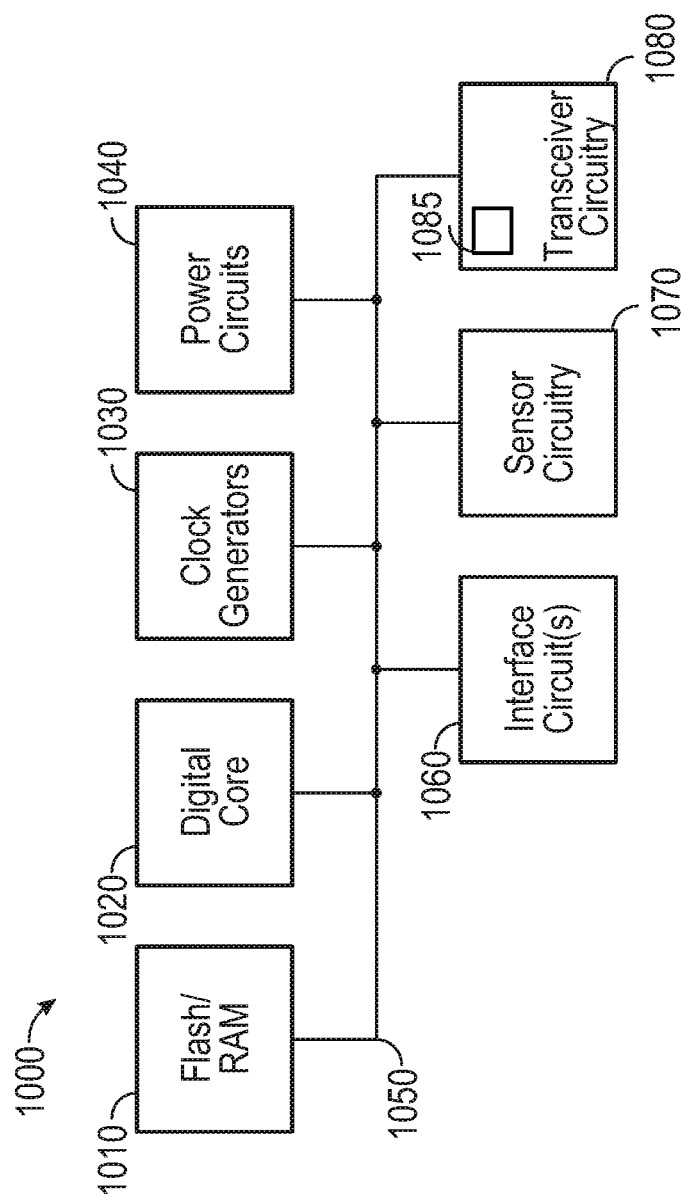
FIG. 10 is a block diagram of a representative integrated circuit in accordance with an embodiment.

Referring now to FIG. 10, shown is a block diagram of a representative integrated circuit 1000 which may include a Doherty PA as described herein. In the embodiment shown in FIG. 10, integrated circuit 1000 may be, e.g., a microcontroller, wireless transceiver or other device that can be used in a variety of use cases, including sensing, metering, monitoring, embedded applications, communications, applications and so forth.

In the embodiment shown, integrated circuit 1000 includes a memory system 1010 which in an embodiment may include a non-volatile memory such as a flash memory and volatile storage, such as RAM. In an embodiment, this non-volatile memory may be implemented as a non-transitory storage medium that can store instructions and data. Such non-volatile memory may store instructions for controlling pre-distortion, scaling and phase shifting operations described herein.

Memory system 1010 couples via a bus 1050 to a digital core 1020, which may include one or more cores and/or microcontrollers that act as a main processing unit of the integrated circuit. In turn, digital core 1020 may couple to clock generators 1030 which may provide one or more phase locked loops or other clock generation circuitry to generate various clocks for use by circuitry of the IC.

As further illustrated, IC 1000 further includes power circuitry 1040, which may include one or more voltage regulators. Additional circuitry may optionally be present depending on particular implementation to provide various functionality and interaction with external devices. Such circuitry may include interface circuitry 1060 which may provide interface with various off-chip devices, sensor circuitry 1070 which may include various on-chip sensors including digital and analog sensors to sense desired signals, such as for a metering application or so forth.

In addition as shown in FIG. 10, transceiver circuitry 1080 may be provided to enable transmission and receipt of wireless signals, e.g., according to one or more of a local area or wide area wireless communication scheme, such as IEEE 802.11, IEEE 802.15.4, Zigbee, Bluetooth, cellular communication or so forth. To this end, transceiver circuitry 1080 may include circuitry 1085 including baseband circuitry to perform auxiliary signal scaling, swapping and inversions, and further including RF circuitry with a Doherty PA as described herein. Understand while shown with this high level view, many variations and alternatives are possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. An apparatus comprising:
   a digital baseband circuit to receive a digital baseband signal and provide a first digital baseband signal to a first transmitter signal path and a second digital baseband signal to a second transmitter signal path, the second digital baseband signal comprising a scaled version of the first digital baseband signal, wherein the digital baseband circuit comprises a scaling circuit to generate the scaled version of the first digital baseband signal and a swap circuit to swap complex portions of the second digital baseband signal to phase shift the second digital baseband signal and to invert a portion of the second digital baseband signal;
   the first transmitter signal path coupled to the digital baseband circuit to process the first digital baseband signal and output a first radio frequency (RF) signal;
   the second transmitter signal path coupled to the digital baseband circuit to process the second digital baseband signal and output a second RF signal;
   a first power amplifier coupled to the first transmitter signal path to amplify the first RF signal and output an amplified first RF signal; and
   a second power amplifier coupled to the second transmitter signal path to amplify the second RF signal and output an amplified second RF signal.

2. The apparatus of claim 1, wherein the second transmitter signal path comprises:
   a converter to convert the second digital baseband signal to a second analog baseband signal; and
   a mixer to upconvert the second analog baseband signal to the second RF signal and provide the second RF signal to the second power amplifier.

3. The apparatus of claim 1, further comprising an LC network coupled to an output of the first power amplifier to convert an impedance of the amplified first RF signal.

4. The apparatus of claim 3, wherein the LC network comprises a series inductor coupled to an output of the first power amplifier and at least one shunt capacitor coupled to the output of the first power amplifier.

5. The apparatus of claim 3, further comprising a balun coupled to the LC network and the second power amplifier to perform a differential-to-single-ended conversion to output a combined RF signal including the amplified first RF signal and the amplified second RF signal.

6. The apparatus of claim 5, wherein the balun is coupled to the LC network and the second power amplifier via a first output node and a second output node, the amplified first RF signal and the amplified second RF signal to be combined into the combined RF signal in a current domain at the first output node and the second output node.

7. The apparatus of claim 1, wherein the second power amplifier comprises a transconductor having:
   a first transistor having a gate terminal to receive the second RF signal and a second terminal to output the amplified second RF signal;
   a second transistor having a first terminal to receive the amplified second RF signal and a second terminal to output the amplified second RF signal; and
   a third transistor having a gate terminal to receive an enable signal, wherein when the digital baseband signal is less than a threshold level, the enable signal is inactive to disable the second power amplifier.

8. The apparatus of claim 1, wherein the scaling circuit comprises a lookup table including a plurality of scaling values.

9. The apparatus of claim 8, wherein the scaling circuit is to select a first scaling value of the plurality of scaling values based on a magnitude of the first digital baseband signal, and generate the scaled version of the first digital baseband signal using the first scaling value.

10. The apparatus of claim 9, wherein when the magnitude of the first digital baseband signal is at or below a threshold level, the second power amplifier is to be disabled.

11. A method comprising:
receiving, in a baseband circuit of a transmitter, a baseband signal including modulated information to be transmitted;
providing the baseband signal to a main signal path of the transmitter and to an auxiliary signal path of the transmitter;
scaling and phase shifting the baseband signal in the auxiliary signal path to obtain an auxiliary baseband signal, based at least in part on magnitude information of the baseband signal;
converting the baseband signal in the main signal path to a main radio frequency (RF) signal and amplifying the main RF signal in a first power amplifier to output an amplified main RF signal;
converting the auxiliary baseband signal in the auxiliary signal path to an auxiliary RF signal and amplifying the auxiliary RF signal in a second power amplifier to output an amplified auxiliary RF signal, the amplified auxiliary RF signal phase-shifted with respect to the amplified main RF signal; and
combining the amplified main RF signal and the amplified auxiliary RF signal into a combined RF signal in a current domain.

12. The method of claim 11, further comprising outputting the combined RF signal to a load circuit, comprising converting an impedance of the combined RF signal to a load impedance level and converting the combined RF signal comprising a differential signal to a single-ended signal to be provided to the load circuit.

13. The method of claim 11, further comprising impedance converting the amplified main RF signal before the combining.

14. The method of claim 11, further comprising pre-distorting the baseband signal for a distortion of at least the first power amplifier and the second power amplifier.

15. The method of claim 11, further comprising when the magnitude information of the baseband signal is equal to or less than a threshold level, disabling the second power amplifier.

16. The method of claim 11, wherein phase shifting the baseband signal comprises inverting an in-phase portion of the baseband signal and swapping the in-phase portion and a quadrature phase portion of the baseband signal.

17. An apparatus comprising:
a digital baseband circuit to receive and process a digital baseband signal, the digital baseband circuit comprising:
a pre-distortion circuit to pre-distort the digital baseband signal based at least in part on a magnitude of the digital baseband signal;
a scaling circuit to scale the pre-distorted digital baseband signal based at least in part on a magnitude of the pre-distorted digital baseband signal; and
a swap circuit to phase shift the scaled pre-distorted digital baseband signal and invert an in-phase portion of the scaled pre-distorted digital baseband signal;
a first digital-to-analog converter to convert a first digital baseband signal comprising the pre-distorted digital baseband signal to a first analog baseband signal;
a second digital-to-analog converter to convert a second digital baseband signal comprising the phase-shifted scaled pre-distorted digital baseband signal to a second analog baseband signal;
a first analog baseband circuit to process the first analog baseband signal;
a second analog baseband circuit to process the second analog baseband signal;
a first mixer to convert the first analog baseband signal to a first radio frequency (RF) signal;
a second mixer to convert the phase-shifted second analog baseband signal to a second RF signal;
a first power amplifier to amplify the first RF signal and output an amplified first RF signal; and
a second power amplifier to amplify the second RF signal and output an amplified second RF signal.

18. The apparatus of claim 17, further comprising:
an LC network coupled to an output of the first power amplifier to convert an impedance of the amplified first RF signal; and
a balun coupled to the LC network and the second power amplifier to perform a differential-to-single-ended conversion to output a combined RF signal including the amplified first RF signal and the amplified second RF signal, wherein the combined RF signal is combined in a current domain.

* * * * *